United States Patent [19]
Harvey et al.

[11] Patent Number: 5,128,564
[45] Date of Patent: Jul. 7, 1992

[54] INPUT BIAS CURRENT COMPENSATION FOR A COMPARATOR

[75] Inventors: Barry Harvey, Los Altos; Joseph Piernet, San Jose, both of Calif.

[73] Assignee: Elantec, Milpitas, Calif.

[21] Appl. No.: 790,677

[22] Filed: Nov. 8, 1991

[51] Int. Cl.[5] .................. H03K 5/00; H03K 17/16; G05F 3/22

[52] U.S. Cl. .................. 307/494; 307/491; 307/296.6

[58] Field of Search .................. 307/355, 296.1, 296.6, 307/491, 494

[56] References Cited

U.S. PATENT DOCUMENTS

| 4,591,743 | 5/1986 | Kung | 307/491 |
| 4,760,286 | 7/1988 | Pigott | 307/491 |
| 5,039,888 | 8/1991 | Bell et al. | 307/355 |

Primary Examiner—Stanley D. Miller
Assistant Examiner—Sinh N. Tran
Attorney, Agent, or Firm—A. C. Smith

[57] ABSTRACT

A current compensation circuit for a comparator includes a pair of switching transistors which supply input bias current to their corresponding comparator input transistors, a pair of current to voltage conversion means which use collector current from the comparator input transistors to turn on and off the appropriate switching transistor when its corresponding comparator input transistor is on, a transistor to generate a negative replica of the input bias current flowing in the comparator input, and a current mirror which is programmed by the replica of the uncompensated input bias current to produce a compensated input bias current to the switching transistors.

7 Claims, 2 Drawing Sheets

INPUT BIAS CURRENT COMPENSATION FOR A COMPARATOR

FIELD OF THE INVENTION

This invention relates to a current compensation circuit for providing bias current to the input transistors of a comparator, and more particularly, to a current compensation circuit utilizing bipolar transistors to switch the input bias current between the inputs of a high speed comparator smoothly and quickly.

BACKGROUND OF THE INVENTION

Comparators are common circuit elements which find application wherever the comparison of voltages is required. To facilitate this function, the comparator input normally comprises two transistors which are connected as a differential amplifier. During operation, the comparator input sources or sinks a small current. This current is referred to as the input bias current, $I_B$, and it corresponds to the base current of the transistors which form the comparator's differential input. Typically, $I_B$ ranges from tens of nanoamps up to tens of microamps, depending on the type of transistor used in the comparator. For example, the low gate current of Field Effect Transistors (FET) means that a comparator based on these devices will have a correspondingly small $I_B$.

In the absence of a current compensation circuit, the circuit driving the comparator must source or sink the necessary input bias current. For low levels of $I_B$, this requirement places little demand on the driving circuit. However, faster comparators are usually based on the high current operation of bipolar transistors and require higher input bias currents to operate properly. The input current demands of high speed comparators are a consequence of the lower and non-linear input impedances of bipolar transistors. As a result, additional demands are placed on the driving circuit since it must be capable of providing large and changing input bias currents. These current demands load the driving circuit and prevent accurate voltage comparisons.

Load is of particular concern where the driving circuit must source current to or sink current from more than one comparator. In this case the accuracy of the driving circuit will be further limited.

The conventional comparator circuit of FIG. 1 represents one approach to limiting the current requirements of the driving circuit by using a buffer circuit 11. The comparator input comprises input transistors 12, 14 which are connected in a standard differential amplifier configuration. For simplicity, only the input of the conventional comparator circuit is shown in FIG. 1.

One input 10 of the buffer circuit 11 is connected to the gate of an input buffer Junction FET (JFET) 16. The JFET 16 is wired as a source follower with its first current carrying terminal connected to a supply voltage, $V_{77}$. Its second current carrying terminal is connected to a second voltage supply through a resistor 18 and to the base of comparator input transistor 12. Similarly, a second input 20 of the buffer circuit 11 is connected to the gate of an input buffer JFET 22. The JFET 22 is wired as a source follower with its first current carrying terminal connected to a supply voltage, $V_{77}$. Its second current carrying terminal is connected to a second voltage supply via resistor 24 and to the base of comparator input transistor 14.

In the conventional comparator circuit of FIG. 1, the low gate current of the source follower JFETs 16, 22 means that the circuit driving the JFET inputs 10, 20 does not need to supply large bias currents to the comparator. This solves the high $I_B$ problem only to create a new problem. JFETs are significantly slower than high speed comparators and thus limit the speed at which the comparator output can be switched.

SUMMARY OF THE INVENTION

The present invention uses bipolar transistor elements to prevent loading of the circuit driving the differential amplifier of a comparator without limiting the speed at which the amplifier operates. A pair of bipolar switching transistors operates in conjunction with the input transistor pair of the differential amplifier to supply input bias current to whichever input transistor is turned on. Each switching transistor is turned on and off smoothly in response to the voltage drop generated in the collector of the input transistor with which it is paired. The input bias current is provided to the switching transistor by a current source which operates in conjunction with a transistor and a current mirror to replicate the bias current required by the input transistors of the differential amplifier.

DETAILED DESCRIPTION OF THE INVENTION

Figure 1:
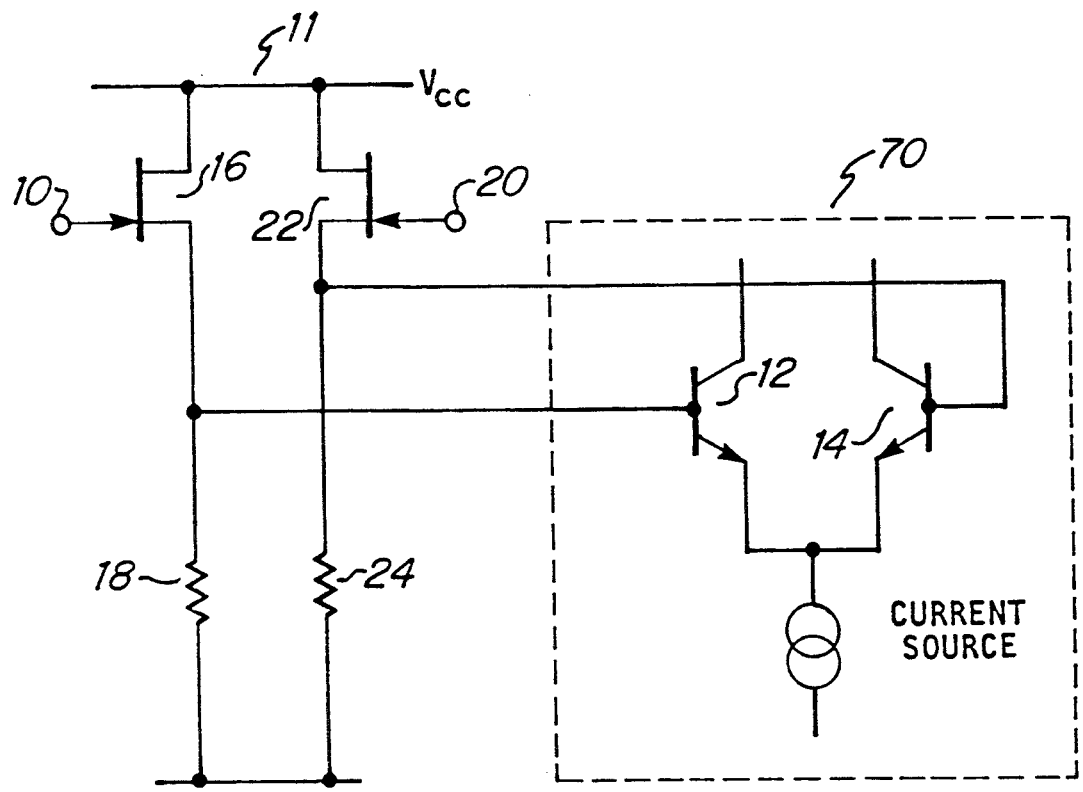
FIG. 1 is a block diagram of a prior art conventional comparator circuit.
Figure 2:
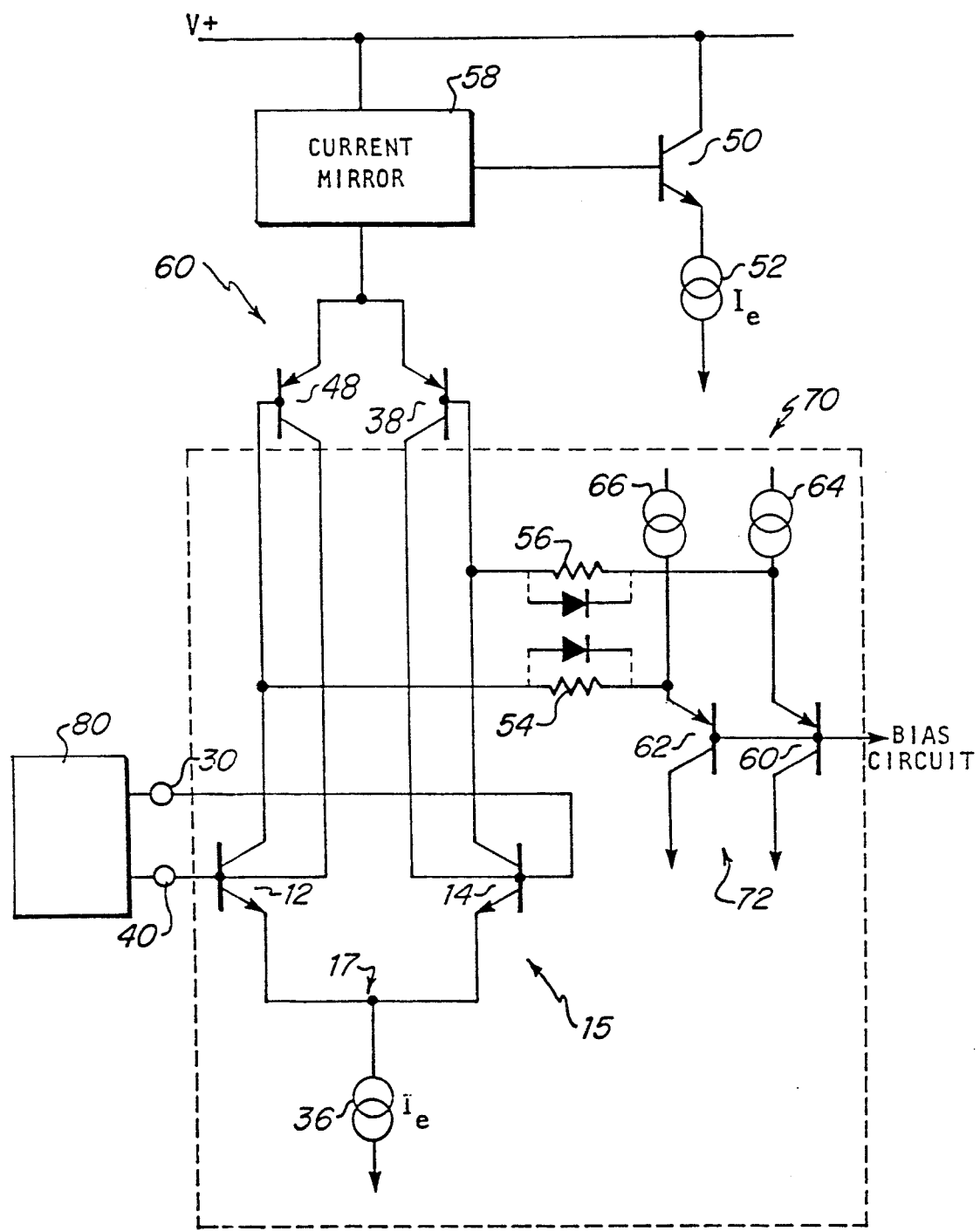
FIG. 2 is a block diagram of the preferred embodiment of the present invention.

Referring now to FIG. 2 there is illustrated one embodiment of the compensator for a comparator circuit according to the present invention, including an input bias current compensation circuit 60 and input circuitry of a comparator 70. The comparator circuit 70 within the dashed line includes a conventional first input stage 15 which is identical to that of FIG. 1 and a second stage input circuit 72 which has been modified for the present invention.

The second stage input circuit 72 customarily includes a pair of pnp transistors 60, 62 and two current sources 64, 66. A pair of current to voltage conversion devices 54, 56 which connect the input stage 15 to the second stage 72 are modifications of a standard comparator circuit which are introduced for the purpose of the present invention. Hereafter, the devices 54, 56 are designated as resistors with the understanding that diodes could also be used.

Referring now to the second stage 72 of the comparator circuit 70, the pnp transistor 60 has its emitter connected to a current source 64 and to the collector of comparator input transistor 14 through the resistor 56. Similarly, the pnp transistor 62 has its emitter connected to a current source 66 and to the collector of comparator input transistor 12 through a resistor 54. In conventional comparators, the bases of transistors 60, 62 are connected to a biasing circuit.

A driving circuit 80 is represented as having outputs $V(in)_A$ and $V(in)_B$ connected to a pair of differential inputs 30, 40 of the comparator circuit 70. The outputs $V(in)_A$ and $V(in)_B$ of the driving circuit 80 so are typically differential outputs. For example, $V(in)_A$ may be grounded while V(in)$_B$ swings between positive and negative voltages.

Referring now to the portion of the circuit above the dashed line in FIG. 2, the compensation circuit of the present invention includes a pnp transistor 48 with its base connected to the collector of comparator input transistor 12 and to the emitter of pnp transistor 62 through a resistor 54. The collector of pnp transistor 48 is connected to the base of comparator input transistor 12. The pnp transistor 38 has its base connected to the collector of comparator input transistor 14 and to the emitter of pnp transistor 60 through a resistor 56. The collector of pnp transistor 38 is connected to the base of comparator input transistor 14. The emitters of the transistors 38,48 are connected together and to the output of a conventional current mirror circuit 58. An npn transistor 50 has its collector connected to a supply voltage and its emitter connected to a current source 52. The base of the transistor 50 is connected to the input of the current mirror 58.

A voltage difference on the comparator inputs 30, 40 turns on one of the comparator input transistors 12, 14, causing a base current to flow in that transistor. The base current is just the input bias current, I$_B$, referred to above. In the operation of the transistor, this base current allows a larger current, I$_E$, to flow in the on transistor and through the common emitter circuit 17 of the comparator input.

Figure 3:
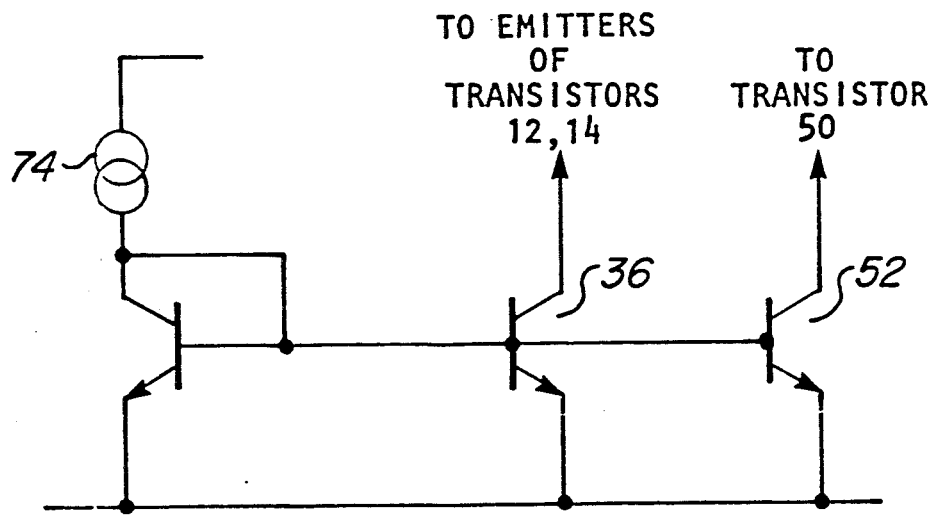
FIG. 3 is a block diagram of a circuit which may be used to create two identical currents.

In the preferred embodiment, the current, I$_E$, is replicated by the current source 52 causing the same current to flow in the emitter of transistor 50. The current, I$_E$, could be replicated in a variety of ways which are well known in the art. One possible circuit for this purpose is shown in FIG. 3, where an external current source 74 programs the currents which flow in both current sources 36, 52 of the compensation circuit.

With the same emitter current flowing in the emitter of transistor 50 as in the emitter of the "on" transistor of the pair of comparator input transistors 12, 14, the base current in the transistor 50 will be I$_B$ for a reasonably matched standard transistor. The base current in transistor 50 controls the current mirror 58 which produces a negative replica of I$_B$. The negative replica of I$_B$ is directed to one of the comparator input transistors 12,14 by the following mechanism.

When the driving circuit 80 elevates the voltage on comparator input 30 higher than the voltage on comparator input 40, comparator input transistor 14 is turned on and comparator input transistor 12 is turned off. With comparator input transistor 14 turned on, collector current flows through the resistor 56. The consequent voltage drop across resistor 56 is sufficient to ensure that the base of pnp transistor 38 is low enough to turn transistor 38 on. With pnp transistor 38 turned on, the input bias current replicated by the current mirror 58 flows through the emitter of transistor 38 to the base of comparator input transistor 14. Since the compensation circuit supplies comparator input transistor 14 with the requisite input bias current, no current demand is made upon the driving circuit 80.

Meanwhile, since the voltage on comparator input 40 is lower than the voltage on input 30, comparator input transistor 12 is turned off and no current flows through the resistor 54. As a result, the voltage on the base of pnp transistor 48 stays above the voltage on the base of transistor 38, holding transistor 48 off. Reversing the states of comparator input transistors 12, 14 shifts the collector current flow from resistor 56 to resistor 54, turning pnp transistor 48 on and pnp transistor 38 off. Thus, the resistors 54, 56 ensure that the pnp transistors 38, 48 are switched on and off smoothly and completely in response to the state of the comparator input transistors 12,14.

In accordance with the present invention, the resistors 54, 56 change the collector voltage of the comparator input transistors 12, 14 to which they are connected, turning the switching transistors 48, 38 on and off in concert with their corresponding comparator input transistors 12, 14. The consequent switching action allows input bias current to be sourced from the current mirror 58 to whichever comparator input transistor 12, 14 is turned on.

We claim:

1. An input bias current compensation circuit for generating bias current and switching said bias current between the input transistors of a high speed comparator having first and second comparator input transistors connected as a differential amplifier and having the outputs of said first and second input transistors connected to the inputs of a second differential stage of said comparator, said compensation circuit comprising;

a first transistor including base, collector, and emitter electrodes and having its collector electrode connected to a voltage supply and its emitter electrode connected to a current source for generating a base current appropriate to the current flowing in the common emitter circuit of said differential amplifier;

a current producing means coupled to the base of said first transistor for sensing the base current therein and for supplying a first current equal to said base current to an output;

first and second switching transistors including base, collector, and emitter electrodes and having their emitter electrodes connected to the output of said current producing means;

said first switching transistor having its collector connected to the base of said first comparator input transistor and its base connected to the collector of said first comparator input transistor for supplying said first current to the base of said first comparator input transistor when said first comparator input transistor is turned on;

said second switching transistor having its collector connected to the base of said second comparator input transistor and its base connected to the collector of said second comparator input transistor for supplying said first current to the base of said second comparator input transistor when said second comparator input transistor is turned on, and;

first and second current to voltage conversion means for changing the voltage at the base electrodes of said switching transistors to turn said switching transistors on and off in response to collector current flowing in said comparator input transistors;

said first conversion means being connected between the base of said first switching transistor and a differential input of said second comparator stage; and, said second conversion means being connected between the base of said second switching transistor and a second differential input of said second comparator stage.

2. The circuit of claim 1, wherein said first and second current to voltage conversion means are a pair of resistors.

3. The circuit of claim 1, wherein said first and second current to voltage conversion means are a pair of diodes.

4. The circuit of claim 2, wherein the current gain of said first transistor is matched to the current gain of the first and second comparator input transistors.

5. The circuit of claim 3, wherein the current gain of said first transistor is matched to the current gain of the first and second comparator input transistors.

6. The circuit of claim 4, wherein the current source connected to the emitter of said first transistor produces a current through said first transistor equal to the current flowing in the common emitter circuit of said first and second comparator input transistors.

7. The circuit of claim 6, wherein said current producing means is a current mirror having an input connected to the base of said first transistor and having an output connected to the emitters of said second and third transistors for supplying input bias current to said first and second switching transistors.

* * * * *